(12) United States Patent
Goldfarb et al.

(10) Patent No.: US 7,944,307 B2
(45) Date of Patent: May 17, 2011

(54) WIDEBAND RF AMPLIFIERS

(75) Inventors: Marc Goldfarb, Atkinson, NH (US);
Edmund J. Balboni, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 6 days.

(21) Appl. No.: 12/407,148

(22) Filed: Mar. 19, 2009

(65) Prior Publication Data

US 2010/0237941 A1    Sep. 23, 2010

(51) Int. Cl.
*H03F 3/68* (2006.01)
(52) U.S. Cl. ........................................ 330/295; 330/290
(58) Field of Classification Search ................. 330/277, 330/290, 295
See application file for complete search history.

(56) References Cited

U.S. PATENT DOCUMENTS

| 4,980,810 A * | 12/1990 | McClanahan et al. .......... 363/16 |
| 5,121,084 A * | 6/1992 | Anderson et al. ............. 330/295 |
| 6,650,180 B2 * | 11/2003 | Lautzenhiser et al. .... 330/124 R |
| 2007/0194804 A1 | 8/2007 | Kase et al. |

\* cited by examiner

*Primary Examiner* — Steven J Mottola
(74) *Attorney, Agent, or Firm* — Knobbe Martens Olson & Bear LLP

(57) ABSTRACT

A device for amplifying signals over a wide frequency range features stacked amplifying modules connected between a DC voltage source and an electrical ground. The stacking configuration reuses the DC current produced the voltage source, and thus reduces the amount of operational DC current permitting the use of lower voltage, higher frequency devices to be used. The amplifying modules are fed signals which are different versions of an input signal, and the output signals are AC coupled using capacitors to balance out gain imbalances and asymmetries between the amplifying modules.

30 Claims, 4 Drawing Sheets

WIDEBAND RF AMPLIFIERS

FIELD OF THE INVENTION

The present invention relates generally to wideband amplifiers used in RF communication systems, and more specifically, to current-stacked amplifiers.

BACKGROUND OF THE INVENTION

Modem communication systems require components, such as a local oscillator (LO) amplifier, which operate in the radio frequency (RF) spectrum and drive other components, e.g., mixers, modulators, and demodulators. However, such components typically suffer from high parasitic capacitance and thus are not able to produce voltage waveforms with large swings and sharp risetimes over a wide range of frequencies. Moreover, such components tend to have larger geometries which result in slower operation speed, and typically utilize large DC currents resulting in higher power consumption.

Current approaches to overcome this problem include using reactive matching techniques, such as using a resonant LC tank circuit at the output of a LO amplifier to obtain a large voltage swing. Such techniques, however, still do not enable the LO amplifier to operate over a wide range of frequencies with reasonable DC power consumption. There is, accordingly, a need for an amplifier that simultaneously operates over a wide range of frequencies, produces voltage waveforms with sharp risetimes, and utilizes minimal DC current.

SUMMARY OF THE INVENTION

In accordance with embodiments of the present invention, the problems of amplifying an input signal over a wide range of frequencies, with fast risetimes and reduced DC power consumption are addressed by using one or more pairs of stacked amplifiers. Stacked amplifiers connected between a DC voltage source and an electrical ground reuse the DC current supplied by the voltage source and thus reduce the amount of operational DC current. Moreover, the supply voltage is approximately equally divided between each amplifier of the pair of stacked amplifiers resulting in smaller voltage drops across each amplifier, permitting lower voltage devices to be used and resulting in a higher frequency of operation at each amplifier in the pair. In various embodiments, devices and methods pertaining to this invention may be used in an RF communication system for amplifying signals over a wide range of frequencies, and thereby using the amplified signals to drive various components, such as a mixer, a modulator, or a demodulator, of the communication system.

Accordingly, in one aspect, the invention pertains to an electronic device for amplifying an input signal. The electronic device includes a first amplifying module and a second amplifying module. The first amplifying module amplifies a first signal and produces a first amplified signal, and the second amplifying module amplifies a second signal and produces a second amplified signal. The first amplifying module may be directly connected to a first DC voltage source; the second amplifying module may be directly connected to an electrical ground; and the first and second modules may be stacked between the first DC voltage source and the electrical ground. At least one of the first amplifying module and the second amplifying module may include an inverter amplifier. In one embodiment, the stacked amplifying modules employ DC feedback to establish a stable DC operating point, resulting in the proportional division of the first DC voltage across the stacked amplifying modules.

In various embodiments, the inverter amplifier includes transistors fabricated using 0.25 micron technology, or electrically isolated transistors fabricated using deep N-well or triple well technology. In one embodiment, at least one of the first amplifying module and the second amplifying module includes two-stage cascaded amplifiers which may result in higher overall gain of the amplifying module. In one embodiment, at least one of the first amplifying module and the second amplifying module includes a self-bias circuit. The self-bias circuit may include a feedback resistor. In one embodiment, the voltage produced by the first DC voltage source is approximately equally divided between the first and second amplifying modules. The input signal may be a radio frequency (RF) signal with a frequency range from about 10 MHz to about 5000 MHz.

In one embodiment, the device further includes an input differential amplifier which receives the input signal and generates multiple signals including the first signal and the second signal. The first signal and the second signal may have 180 degree phase difference. The differential amplifier may include a bipolar junction transistor (BJT).

In another embodiment, the device further includes a splitter which receives the input signal and splits the input signal into multiple signals including the first signal and the second signal. The first signal may include voltage values of the input signal exceeding a predetermined voltage value, and the second signal may include voltage values of the input signal falling below the predetermined voltage value.

In one embodiment, the device further includes a third amplifying module, a fourth amplifying module, a first combiner, and a second combiner. The third amplifying module amplifies the second signal to produce a third amplified signal, and the fourth amplifying module amplifies the first signal to produce a fourth amplified signal. The third amplifying module may be directly connected to a second DC voltage source; the fourth amplifying module may be directly connected to the electrical ground; and the third and fourth amplifying modules may be stacked between the second DC voltage source and the electrical ground.

The first combiner combines the first amplified signal and the fourth amplified signal to produce a first output signal, and the second combiner for combining the second amplified signal and the third amplified signal to produce a second output signal. In one embodiment, the first and the second combiner each include a first and a second coupling capacitor. In one embodiment, at least one of the third amplifying and the fourth amplifying modules include two-stage cascaded amplifiers. In other embodiments, at least one of the third amplifying and fourth amplifying modules includes an amplifier having three or more stages.

In another aspect, the invention pertains to a method of amplifying an input signal. The method includes amplifying a first signal by a first amplifying module to produce a first amplified signal, and amplifying a second signal by a second amplifying module to produce a second amplified signal. The first amplifying module may be directly connected to a first DC voltage source; the second amplifying module may be directly connected to an electrical ground; and the first and second modules may be stacked between the first DC voltage source and the electrical ground. In one embodiment, at least one of the first amplifying module and the second amplifying module include an inverter amplifier. In another embodiment, the method further comprises utilizing DC feedback to establish a stable DC operating point across the stacked amplifying modules, resulting in the proportional division of the first DC voltage across the stacked amplifying modules.

In one embodiment, the method further includes receiving the input signal and generating multiple signals including the first signal and the second signal. The first signal and the second signal may have 180 degree phase difference.

In another embodiment, the method further includes receiving the input signal and splitting the input signal into multiple signals including the first signal and the second signal. The first signal may include voltage values of the input signal exceeding a predetermined voltage value, and the second signal may include voltage values of the input signal falling below the predetermined voltage value.

In one embodiment, the method further includes amplifying the second signal by a third amplifying module to produce a third amplified signal; amplifying the first signal by a fourth amplifying module to produce a fourth amplified signal; combining the first and fourth amplified signals to produce a first output signal; and combining the second and third amplified signals to produce a second output signal. The third amplifying module may be directly connected to a second DC voltage source; the fourth amplifying module may be directly connected to an electrical ground; and the first and second modules may be stacked between the second DC voltage source and the electrical ground.

In one embodiment, the method further includes stabilizing at least one of the first and the second amplifying module with negative feedback using a self-bias circuit. The self-bias circuit may include a feedback resistor.

In one embodiment, the method further includes shunting, via a shunting capacitor, AC voltage from an intermediate node between the stacked first and second amplifying modules.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION OF THE INVENTION

In general, the present invention pertains in various embodiments to devices and methods for amplifying an input signal. To provide an overall understanding of the invention, certain illustrative embodiments are described, including devices and methods for amplifying an input signal in, e.g. radio frequency (RF) range from about 10 MHz to about 5000 MHz, in a RF communication system by using stacked amplifying modules.

Figure 1:
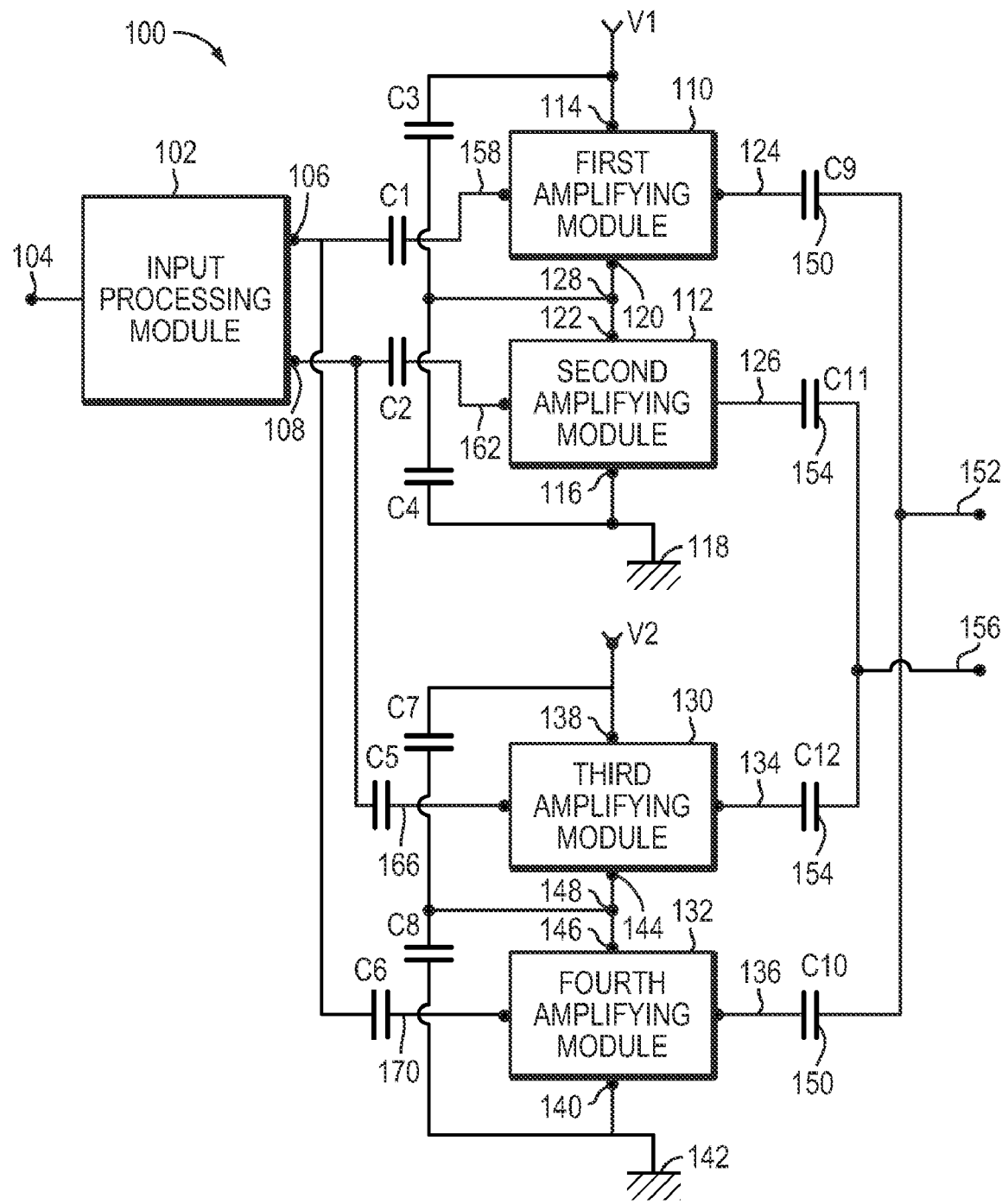
FIG. 1 is a schematic of an electronic device according to an illustrative embodiment of the invention.

Refer to FIG. 1, which depicts an electronic device 100 for amplifying an input signal according to an illustrative embodiment of the invention. The illustrated device includes an input processing module 102 which may be configured to receive an input signal 104 and process it to generate a first signal 106 and a second signal 108. In one embodiment, the input processing module 102 includes a differential amplifier. The differential amplifier may have two input terminals, with one terminal being connected to an electrical ground and the other terminal receiving the input signal 104, thus acting as a single-ended to differential amplifier.

At the output, the differential amplifier generates the first signal 106 which may be in-phase with the input signal 104, and the second signal 108 which may be 180 degrees out-of-phase with the input signal 104. The differential amplifier may be a single stage or a two-stage amplifier, and may include bipolar junction transistors (BJTs), or field-effect transistors (FETs), or both.

In another embodiment, the input processing module 102 includes a splitter which receives the input signal 104 and split it into the first signal 106 and the second signal 108, each having the same DC common mode voltage as provided by the input processing module 102. After DC filtering by capacitors C1, C6 the first signal 106 may include voltage values of the input signal 104 exceeding a predetermined voltage value, as measured at node 158, and may include voltage values of the input signal falling below the predetermined value at node 170, and, after DC filtering by capacitors C2, C5, the second signal 108 may include voltage values of the input signal 104 falling below the predetermined voltage value as measured at node 162, and may include voltage values of the input signal exceeding a predetermined voltage value as measured at node 166. In one embodiment, the predetermined voltage value is half of the supply voltage.

In one embodiment, the first signal 106 is coupled to a first amplifying module 110 through a coupling capacitor C1, and the second signal 108 is coupled to a second amplifying module 112 through a coupling capacitor C2. The coupling capacitors C1, C2 block any DC component in the signals 106, 108, thereby keeping the DC bias settings of the first amplifying module 110 and the second amplifying module 112 undisturbed. However, such coupling capacitors may suffer from degraded performance at low frequencies, and thus are required to have very high capacitance values which are difficult to fabricate on integrated circuits. Accordingly, in one alternative embodiment, the signals 106, 108 are coupled to the amplifying modules 110, 112 using transformers which, like capacitors, provide DC isolation.

In one embodiment, a voltage terminal 114 of the first amplifying module 110 is directly connected to a first DC voltage source V1, and a voltage terminal 116 of the second amplifying module 112 is connected to an electrical ground 118. In the same embodiment, the first and second amplifying modules 110, 112 are stacked, i.e., connected in series at terminals 120, 122, between the first voltage source V1 and the electrical ground 118. Due to the stacking of the two amplifying modules, the voltage from the source V1 will be divided across the amplifying modules 110, 112 proportional to their overall impedance values. The DC current from the voltage source V1 may also be reduced and be reused between the amplifying modules 110, 112.

In one embodiment, both amplifying modules 110, 112 include an inverter amplifier with identical implementation, resulting in approximately equal impedance values of the modules 110, 112. The implementation and functioning of such an inverter amplifier is discussed in detail below.

The voltage produced by the first voltage source V1 may be divided approximately equally between the first amplifying module 110 and the second amplifying module 112. For example, if the voltage source V1 produces 5V, there may be about 2.5V voltage drop across each of the amplifying modules 110, 112. However, the first amplifying module 110 being directly connected to the voltage source V1 may get the upper half of the total voltage drop, i.e., 2.5-5V, across itself. Accordingly, the first amplifying module 110 amplifies the first signal 106 to produce a first amplified signal 124 with a voltage swing which may lie between 2.5-5V peak-to-peak. In the same manner, the second amplifying module 112 being directly connected to the electrical ground 118 may see the lower half of the total voltage drop, i.e., 0-2.5V, and amplifies the second signal 108 to produce a second amplified signal 126 with a voltage swing which may lie between 0-2.5V peak-to-peak. In some implementations, the voltage division will be made precise by the presence of a large DC gain and substantial DC feedback in the first and second amplifying modules. This description anticipates implementations where the feedback can be generated using the same elements within the amplifying modules that provide AC gain, or through the use of ancillary circuitry.

In some implementations, the first voltage source V1 may supply an undesirable AC component along with the DC component, which may not allow the DC voltage across the amplifying modules 110, 112 to be divided proportionally and stay at a fixed value. Accordingly, to prevent such an AC component from affecting the voltage drop across the amplifying modules 110, 112, e.g. approximately half of the voltage from the source V1 as discussed above, a decoupling capacitor C3 is connected between the first voltage source V1 and node 128 and a decoupling capacitor C4 is connected between the node 128 and the electrical ground 118. Capacitors C3, C4 shunt the AC component from the voltage source V1 and stabilize the voltage drop between the amplifying modules 110, 112.

In a stacked amplifier structure as described above, for an approximately equal voltage drop both the first and the second amplifying modules 110, 112 would be designed to have identical voltage swing at their respective outputs. However, in practice because of the various factors, including parasitic capacitances of the amplifying modules and the operation of each module in different voltage ranges (first amplifying module 110 range: 2.5-5V and second amplifying module 112 range: 0-2.5V), it has been found that gain imbalances are introduced in the stacked first and second amplified signals 124, 126. To compensate for this, in one embodiment, a third amplifying module 130 and a fourth amplifying module 132 are used.

Still referring to FIG. 1, the second signal 108 is coupled with the third amplifying module 130 through a capacitor C5 to produce a third amplified signal 134, and the first signal 106 is coupled with the fourth amplifying module 132 through a capacitor C6 to produce a fourth amplified signal 136. The capacitors C5, C6 play the same role of blocking DC as capacitors C1, C2. A voltage terminal 138 of the third amplifying module 130 is directly connected to a second DC voltage source V2, and a voltage terminal 140 of the fourth amplifying module 132 is connected to an electrical ground 142. Like the first and second amplifying modules 110, 112, the third and fourth amplifying modules 130, 132 are stacked with a series connection between the nodes 144, 146. In theory, any number of pairs of amplifying modules may be used in device 100, but in practice the parasitic effects of various components may limit that number.

In one embodiment, the third and fourth amplifying modules 130, 132 are identical in implementation, and are identical to the first and second amplifying modules 110, 112, respectively. Also, the voltage produced by the second voltage source V2 may be equal to the voltage from the source V1.

Accordingly, the voltage from the source V2 is divided approximately equally across the amplifying modules 130, 132, and these modules have the same voltage drops as the amplifying modules 110, 112, e.g., 2.5V voltage drop, if V2, like V1, is producing 5V.

To stabilize this division of voltage, decoupling capacitors C7, C8 are connected between the second voltage source V2 and the node 148, and between the node 148 and the electrical ground 142. However, it is important to note that the fourth amplifying module 132 amplifying first signal 106, being diametrically opposite to the first amplifying module 110, operates and produces a voltage swing in the lower range of the voltage from the source V2, e.g. between 0-2.5V. Similarly, the third amplifying module 130 amplifies the second signal 108, and unlike the second amplifying module 112, produces a voltage swing in the higher range, between 2.5-5V, of the voltage source V2.

In one embodiment, the first amplified signal 124 and the fourth amplified signal 136 are combined using a first combiner 150 including capacitors C9, C10, which AC couples the amplified signals 124, 136 to produce a first output signal 152. In another embodiment, the second amplified signal 126 and the third amplified signal 134 are combined using a second combiner 154 including capacitors C11, C12, which AC couples the amplified signals 126, 134 to produce a second output signal 156. Such combinations may result in balancing out gain imbalances and asymmetries generated between the different sets of stacked amplifying modules. In another embodiment, the output signals 152, 156 are out-of-phase by approximately 180 degrees. In yet another embodiment, the combiners 150, 154 include transformers, transmission lines, or other impedance matching elements.

Figure 2:
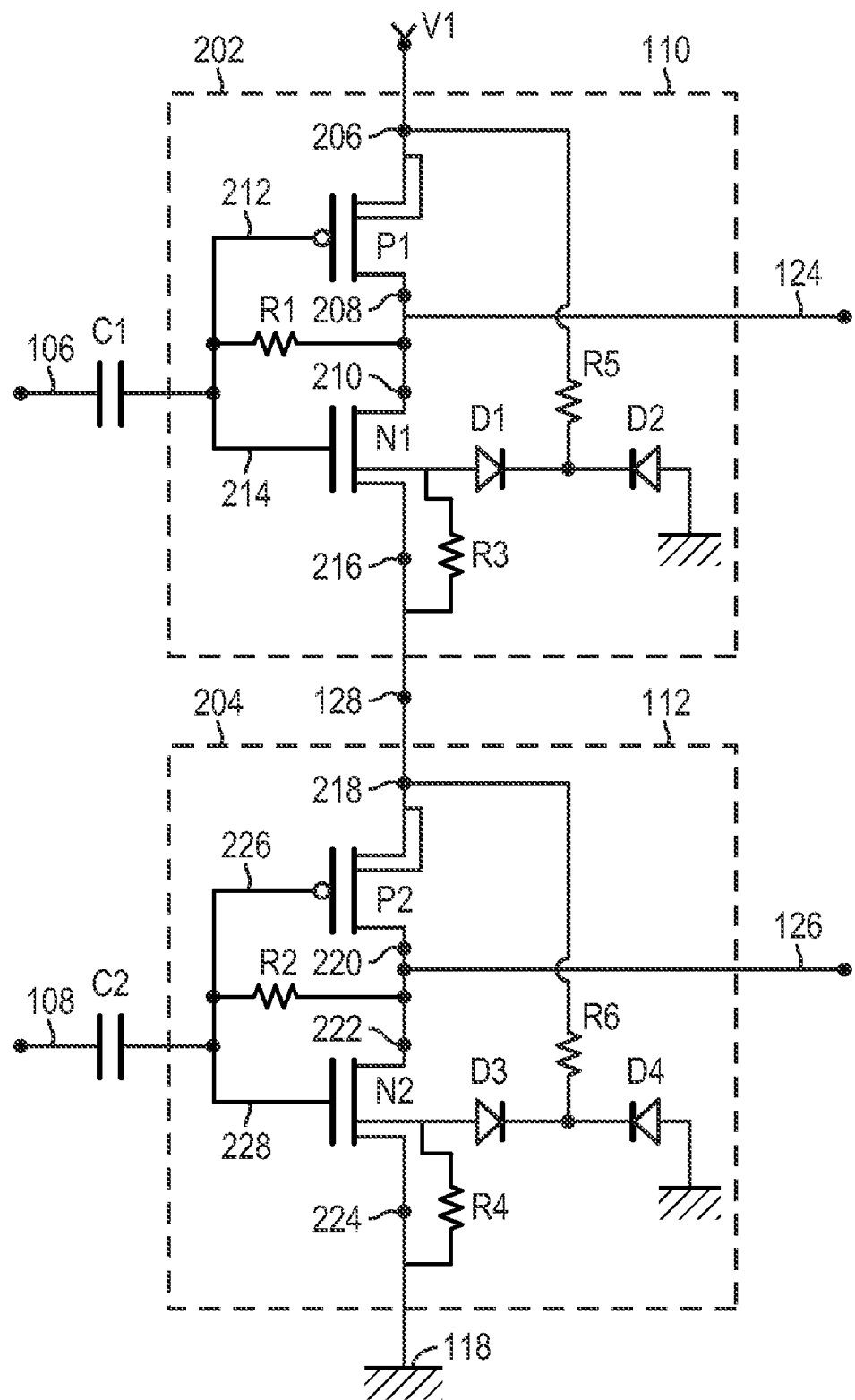
FIG. 2 is a schematic of amplifying modules of the device depicted in FIG. 1 according to one embodiment of the invention.

FIG. 2 shows the detailed construction of an embodiment of the stacked structure of two amplifying modules, e.g., modules 110, 112 or modules 138, 140, as described above with respect to FIG. 1. However, for clarity, we will describe FIG. 2 as an illustration of the stacked modules 110, 112, and accordingly, use the same labels for the components shown in both FIGS. 1 and 2.

In this embodiment, the stacked amplifying modules 110, 112 are implemented as inverter amplifiers 202, 204, each including a PMOS and a NMOS transistor. In alternative embodiments, the inverter amplifiers 202, 204 include bipolar junction transistors (BJT). As shown in FIG. 2, the source 206 of a PMOS transistor P1 of the amplifier 202 is connected to the first DC voltage source V1, and the drain 208 is connected to the drain 210 of a NMOS transistor N1. The gates 212, 214 of the transistors P1, N1 receive the same signal, i.e., the first signal 106 after being passed through the blocking capacitor C1.

The amplifiers 202, 204 are stacked over each other by connecting the source 216 of the transistor N1 with the source 218 of the PMOS transistor P2 of the amplifier 204. The drain 220 of the transistor P2 is connected to the drain 222 of the transistor N2, and the source 224 of the transistor N2 is connected to the electrical ground 118. The gates 226, 228 of the transistors P2, N2 are provided the DC blocked second signal 108. The inverter amplifiers 202, 204 process the first and second signals 106, 108, and produce the first and second amplified output signals 124, 126.

In one embodiment, the inverter amplifiers 202, 204 each include a self-bias circuit including feedback resistors R1, R2. The feedback resistors R1, R2 improve the stability of the amplifiers 202, 204 by tackling the problem of change in operating current in the amplifier due to change in the ambient temperature. The feedback resistors R1, R2 maintain an almost fixed bias voltage at the amplifiers 202, 204. For example, if V1 provides 5V, the inverter amplifier 202 is self-biased at about half of its voltage drop of 2.5-5V, i.e., at approximately 3.75V, and the inverter amplifier 204 is self-biased at about half of its voltage drop of 0-2.5V, i.e., at approximately 1.25V.

In one embodiment, the transistors P1, N1, P2, N2 are fabricated using complementary MOSFET 0.25 micron technology. As 0.25u MOSFETs cannot operate at voltages greater than approximately 2.5V, it is important that the transistors are electrically isolated from the substrate to avoid catastrophic failure of the device. Various fabrication technologies, such as the deep N-well method or the triple well method may be used.

Using deep N-well technology, NMOS transistors N1, N2 may be formed inside a P-doped well which may itself be in an N-doped well. Alternately, both wells may be formed on a P-doped structure. Similarly, PMOS transistors may be formed inside a N-doped well. Due to the presence of P- and N-wells, there may be parasitic diodes formed at the P-N junctions. In one embodiment, for transistor N1, a diode D1 is formed from a P-doped well inside a N-doped well. A second diode D2 may be formed from the N-doped well and the P-doped substrate. In one embodiment, both diodes D1, D2 are reversed biased to prevent current flowing through them.

A resistor R3 is added to keep the DC level of the body contact of transistor N1 at its source potential. Diodes D3, D4 illustrate the parasitic components formed due to deep N-well implementation of the transistor N2. A resistor R4 is added to keep the DC level of the body contact of transistor N2 at its source potential. Other isolation technologies such as silicon on insulator (SOI) technology may be used to fabricate the transistors in the amplifiers 202, 204. The resistor R5 connects the deep N-well to the source of P2 to maintain the deep n-well at a sufficiently high potential to keep it reversed biased. The resistor R6 similarly connects the deep N-well to the source of P1 to maintain the deep n-well at a sufficiently high potential to keep it reversed biased. In other embodiments, these resistors R5, R6 may be connected, either singly or together, directly to the most positive supply voltage.

Figure 3:
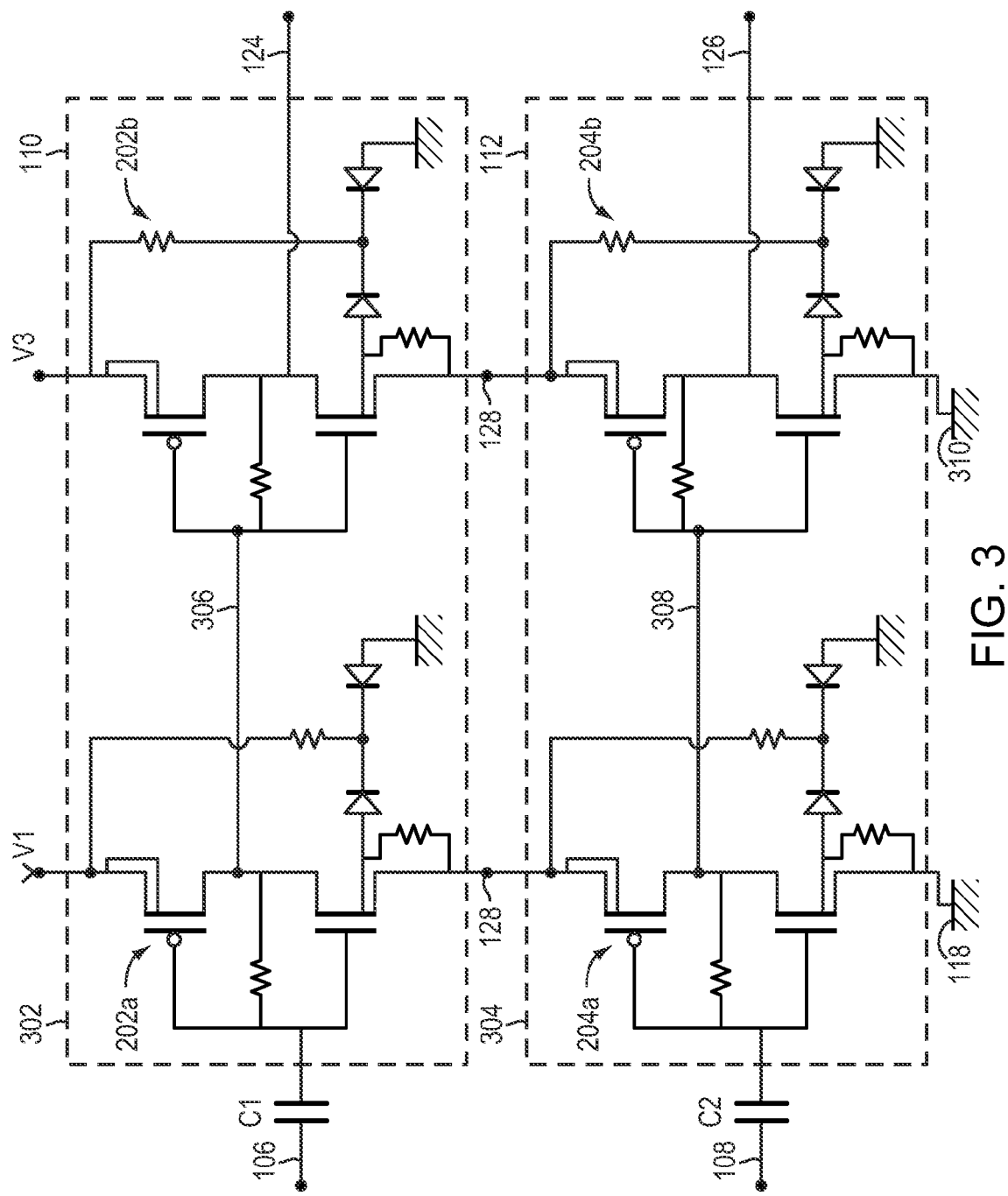
FIG. 3 is a schematic of amplifying modules of the device depicted in FIG. 1 according to another embodiment of the invention.

FIG. 3 illustrates another embodiment of the detailed construction of the stacked amplifying modules described in FIG. 1. In this embodiment, amplifying modules, e.g., modules 110, 112 of FIG. 1, include two-stage cascaded inverter amplifiers 302, 304. This configuration may be used in applications where higher gains are desired across the device 100.

In one embodiment, each stage of the inverter amplifiers 302, 304 is identical to the inverter amplifiers 202, 204. First stages 202a, 204a and second stages 202b, 204b of the amplifiers 302, 304 are stacked with each other. Stages 202a, 202b may be connected to the same voltage source, e.g., the first voltage source V1, or to different voltage sources with different values. The first stage 202a receives the DC blocked first signal 106 and processes it to produce a first intermediate signal 306. The second stage 202b receives the first intermediate signal 306 as the input and processes it to produce the first amplified signal 124. Similarly, the first stage 204a produces a second intermediate signal 308, which is fed to the second stage 204b to produce the second amplified signal 126.

Figure 4B:
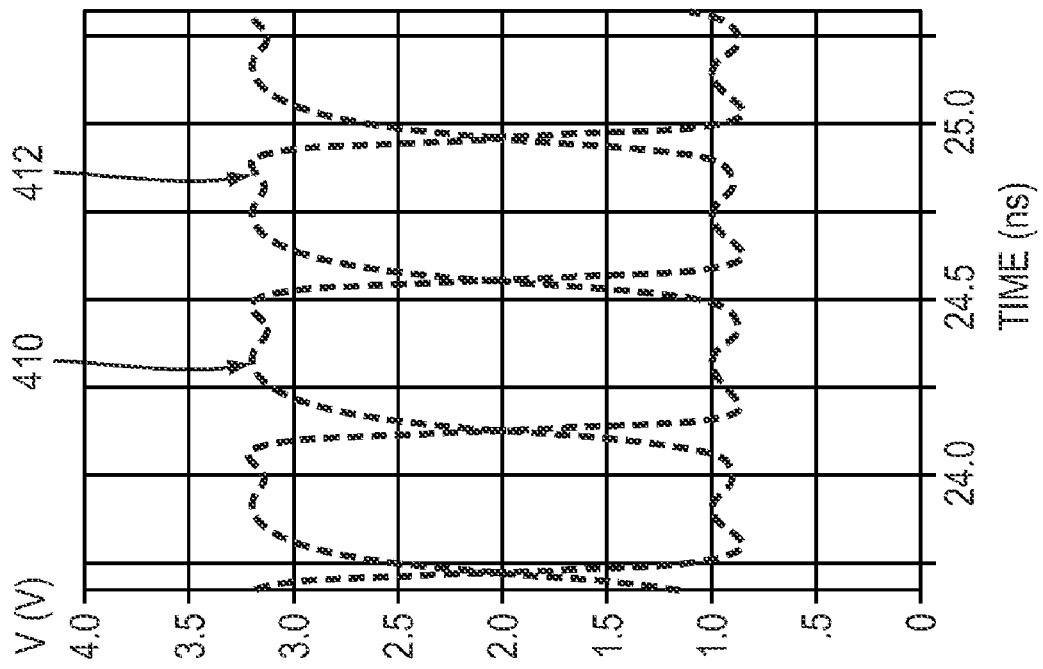
FIG. 4b is a graph illustrating signals at the output of the combiners depicted in FIG. 1.
Figure 4A:
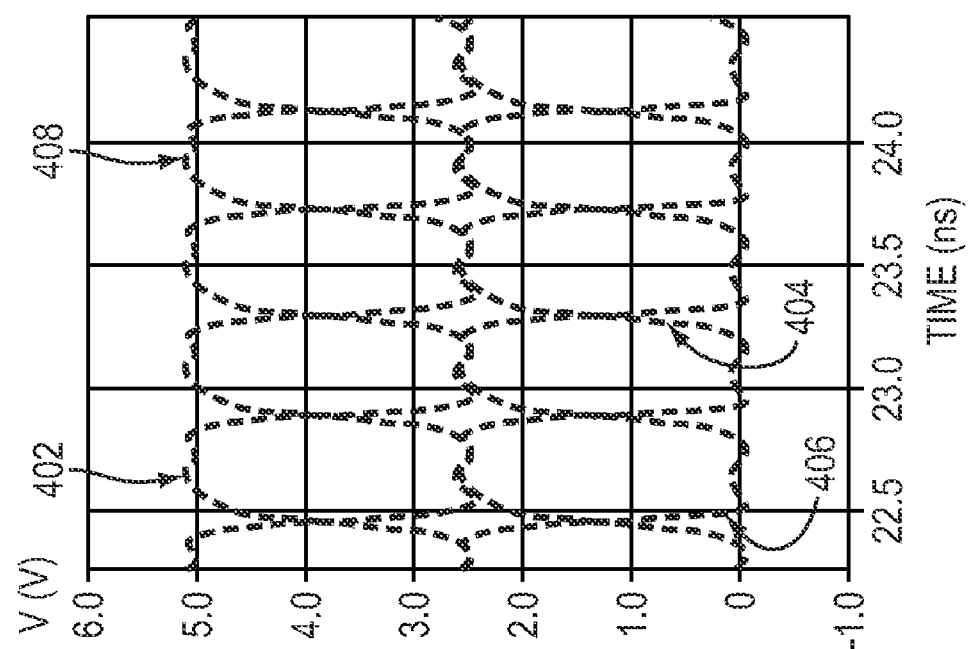
FIG. 4a is a graph illustrating signals at the output of the amplifying modules depicted in FIG. 1.

FIG. 4a plots the amplified signals 124, 126, 134, 136 at the output of the amplifying modules 110, 112, 130, 132 versus time for the embodiment of FIG. 1. Plots 402, 404 show the voltage swings between about 2.5-5V and about 0-2.5V for the first amplified signal 124 and the fourth amplified signal 136, respectively. Plots 406, 408 show the voltage swings between about 0-2.5V and about 2.5-5V for the second amplified signal 126 and the third amplified signal 134, respectively.

FIG. 4b plots the first and second output signals 152, 156 obtained at the outputs of the combiners 150, 154 versus time. Plots 410, 412 show the nearly square output signals 152, 156 with an equal voltage swing of about 2.5V peak-to-peak between the range of about 1-3.5V.

It will therefore be seen that the foregoing represents a highly advantageous approach to amplify signals over a wide range of frequencies in a RF communication system. The terms and expressions employed herein are used as terms of description and not of limitation and there is no intention, in the use of such terms and expressions, of excluding any equivalents of the features shown and described or portions thereof, but it is recognized that various modifications are possible within the scope of the invention claimed.

What is claimed is:

1. An electronic device for amplifying an input signal, the device comprising:
   a first amplifying module for amplifying a first signal to produce a first amplified signal, the first amplifying module being directly connected to a first DC voltage source; and
   a second amplifying module for amplifying a second signal to produce a second amplified signal, the second amplifying module being directly connected to an electrical ground;
   wherein the first and second amplifying modules are stacked between the first DC voltage source and the electrical ground, wherein the stacked amplifying modules employ DC feedback to establish a stable DC operating point, resulting in the proportional division of the first DC voltage across the stacked amplifying modules.

2. An electronic device for amplifying an input signal, the device comprising:
   a first amplifying module for amplifying a first signal to produce a first amplified signal, the first amplifying module being directly connected to a first DC voltage source;
   a second amplifying module for amplifying a second signal to produce a second amplified signal, the second amplifying module being directly connected to an electrical ground, wherein the first and second amplifying modules are stacked between the first DC voltage source and the electrical ground; and
   an input differential amplifier for receiving the input signal and generating multiple signals including the first signal and the second signal, wherein the first signal and the second signal have 180 degree phase difference.

3. An electronic device for amplifying an input signal, the device comprising:
   a first amplifying module for amplifying a first signal to produce a first amplified signal, the first amplifying module being directly connected to a first DC voltage source;
   a second amplifying module for amplifying a second signal to produce a second amplified signal, the second amplifying module being directly connected to an electrical ground, wherein the first and second amplifying modules are stacked between the first DC voltage source and the electrical ground; and
   a splitter for receiving the input signal and splitting the input signal into multiple signals including the first signal and the second signal, the first signal comprising voltage values of the input signal exceeding a predetermined voltage value, and the second signal comprising voltage values of the input signal falling below the predetermined voltage value.

4. The device of claim 2, wherein at least one of the first amplifying module or the second amplifying module comprises an inverter amplifier.

5. An electronic device for amplifying an input signal, the device comprising:
a first amplifying module for amplifying a first signal to produce a first amplified signal, the first amplifying module being directly connected to a first DC voltage source; and
a second amplifying module for amplifying a second signal to produce a second amplified signal, the second amplifying module being directly connected to an electrical ground;
wherein the first and second amplifying modules are stacked between the first DC voltage source and the electrical ground;
wherein at least one of the first amplifying module or the second amplifying module comprises an inverter amplifier, wherein the inverter amplifier comprises one or more 0.25 micron transistors.

6. The device of claim 4, wherein the inverter amplifier comprises an electrically isolated PMOS transistor and an electrically isolated NMOS transistor.

7. An electronic device for amplifying an input signal, the device comprising:
a first amplifying module for amplifying a first signal to produce a first amplified signal, the first amplifying module being directly connected to a first DC voltage source; and
a second amplifying module for amplifying a second signal to produce a second amplified signal, the second amplifying module being directly connected to an electrical ground;
wherein the first and second amplifying modules are stacked between the first DC voltage source and the electrical ground;
wherein at least one of the first amplifying module or the second amplifying module comprises an inverter amplifier, wherein the inverter amplifier comprises an electrically isolated transistor, wherein the electrically isolated transistor comprises a deep N-well or triple well transistor.

8. The device of claim 2, wherein the input differential amplifier comprises a bipolar junction transistor (BJT).

9. The device of claim 2, wherein at least one of the first amplifying module or the second amplifying module comprises two-stage cascaded amplifiers.

10. An electronic device for amplifying an input signal, the device comprising:
a first amplifying module for amplifying a first signal to produce a first amplified signal, the first amplifying module being directly connected to a first DC voltage source;
a second amplifying module for amplifying a second signal to produce a second amplified signal, the second amplifying module being directly connected to an electrical ground;
wherein the first and second amplifying modules are stacked between the first DC voltage source and the electrical ground;
a third amplifying module for amplifying the second signal to produce a third amplified signal, the third amplifying module being directly connected to a second DC voltage source;
a fourth amplifying module for amplifying the first signal to produce a fourth amplified signal, the fourth amplifying module being directly connected to the electrical ground, wherein the third and fourth amplifying modules are stacked between the second DC voltage source and the electrical ground;
a first combiner for combining the first amplified signal and the fourth amplified signal to produce a first output signal; and
a second combiner for combining the second amplified signal and the third amplified signal to produce a second output signal.

11. The device of claim 10, wherein the first combiner comprises a first coupling capacitor.

12. The device of claim 10, wherein the second combiner comprises a second coupling capacitor.

13. The device of claim 10, wherein at least one of the first combiner or the second combiner comprises a transformer, a transmission line, or a multiplicity of inductors, and capacitors.

14. The device of claim 10, wherein at least one of the third amplifying module or the fourth amplifying module comprises two-stage cascaded amplifiers.

15. An electronic device for amplifying an input signal, the device comprising:
a first amplifying module for amplifying a first signal to produce a first amplified signal, the first amplifying module being directly connected to a first DC voltage source; and
a second amplifying module for amplifying a second signal to produce a second amplified signal, the second amplifying module being directly connected to an electrical ground;
wherein the first and second amplifying modules are stacked between the first DC voltage source and the electrical ground;
wherein at least one of the first amplifying module or the second amplifying module comprises a self-bias circuit.

16. The device of claim 14, wherein the self-bias circuit comprises a feedback resistor.

17. The device of claim 2, wherein the voltage produced by the first DC voltage source is approximately equally divided between the first and second amplifying modules.

18. The device of claim 2, wherein the input signal comprises a radio frequency (RF) signal with a frequency range from about 10 MHz to about 5000 MHz.

19. A method of amplifying an input signal, the method comprising:
amplifying a first signal to produce a first amplified signal using a first amplifying module, the first amplifying module being directly connected to a first DC voltage source;
amplifying a second signal to produce a second amplified signal using a second amplifying module, the second amplifying module being directly connected to an electrical ground;
wherein the first and second amplifying modules are stacked between the first DC voltage source and the electrical ground; and
receiving the input signal and generating multiple signals including the first signal and the second signal, wherein the first signal and the second signal have 180 degree phase difference.

20. A method of amplifying an input signal, the method comprising:

amplifying a first signal to produce a first amplified signal using a first amplifying module, the first amplifying module being directly connected to a first DC voltage source;

amplifying a second signal to produce a second amplified signal using a second amplifying module, the second amplifying module being directly connected to an electrical ground;

wherein the first and second amplifying modules are stacked between the first DC voltage source and the electrical ground; and splitting the input signal into multiple signals including the first signal and the second signal, the first signal comprising voltage values of the input signal exceeding a predetermined voltage value, and the second signal comprising voltage values of the input signal falling below the predetermined voltage value.

21. The method of claim 19, wherein at least one of the first amplifying module or the second amplifying module comprises an inverter amplifier.

22. A method of amplifying an input signal, the method comprising:

amplifying a first signal to produce a first amplified signal using a first amplifying module, the first amplifying module being directly connected to a first DC voltage source;

amplifying a second signal to produce a second amplified signal using a second amplifying module, the second amplifying module being directly connected to an electrical ground;

wherein the first and second amplifying modules are stacked between the first DC voltage source and the electrical ground;

amplifying the second signal to produce a third amplified signal using a third amplifying module, the third amplifying module being directly connected to a second DC voltage source;

amplifying the first signal to produce a fourth amplified signal using a fourth amplifying module, the fourth amplifying module being directly connected to an electrical ground, wherein the third and fourth amplifying modules are stacked between the second DC voltage source and the electrical ground;

combining the first amplified signal and the fourth amplified signal to produce a first output signal; and combining the second amplified signal and the third amplified signal to produce a second output signal.

23. A method of amplifying an input signal, the method comprising:

amplifying a first signal to produce a first amplified signal using a first amplifying module, the first amplifying module being directly connected to a first DC voltage source;

amplifying a second signal to produce a second amplified signal using a second amplifying module, the second amplifying module being directly connected to an electrical ground;

wherein the first and second amplifying modules are stacked between the first DC voltage source and the electrical ground; and stabilizing at least one of the first amplifying module or the second amplifying module using a self-bias circuit.

24. The method of claim 23, wherein the self-bias circuit comprises a feedback resistor.

25. The method of claim 19 further comprising shunting AC voltage from an intermediate node between the stacked first and second amplifying modules via a shunting capacitor.

26. A method of amplifying an input signal, the method comprising:

amplifying a first signal to produce a first amplified signal using a first amplifying module, the first amplifying module being directly connected to a first DC voltage source;

amplifying a second signal to produce a second amplified signal using a second amplifying module, the second amplifying module being directly connected to an electrical ground;

wherein the first and second amplifying modules are stacked between the first DC voltage source and the electrical ground; and utilizing DC feedback to establish a stable DC operating point across the stacked amplifying modules, resulting in the proportional division of the first DC voltage across the stacked amplifying modules.

27. The device of claim 10:

wherein the first combiner comprises a first coupling capacitor configured to capacitively couple the first amplified signal and the first output signal and a second coupling capacitor configured to capacitively couple the fourth amplified signal and the first output signal;

wherein the second combiner comprises a third coupling capacitor configured to capacitively couple the second amplified signal and the second output signal and a fourth coupling capacitor configured to capacitively couple the third amplified signal and the second output signal.

28. An apparatus for amplifying an input signal, the apparatus comprising:

a first amplifying module configured to amplify a first signal to generate a first amplified signal, the first amplifying module being directly connected to a first voltage reference;

a second amplifying module configured to amplify a second signal to generate a second amplified signal, the second amplifying module being directly connected to a second voltage reference, wherein the first and second amplifying modules are stacked between the first voltage reference and the second voltage reference; and an input differential amplifier configured to receive the input signal and to generate multiple signals including the first signal and the second signal, wherein the first signal and the second signal have 180 degree phase difference.

29. An apparatus for amplifying an input signal, the apparatus comprising:

a first amplifying module configured to amplify a first signal to generate a first amplified signal, the first amplifying module being directly connected to a first DC voltage source;

a second amplifying module configured to amplify a second signal to generate a second amplified signal, the second amplifying module being directly connected to an electrical ground;

wherein the first and second amplifying modules are stacked between the first DC voltage source and the electrical ground;

a third amplifying module configured to amplify the second signal to generate a third amplified signal, the third amplifying module being directly connected to a second DC voltage source;

a fourth amplifying module configured to amplify the first signal to generate a fourth amplified signal, the fourth amplifying module being directly connected to the electrical ground, wherein the third and fourth amplifying modules are stacked between the second DC voltage source and the electrical ground;

a first combiner configured to combine the first amplified signal and the fourth amplified signal to generate a first output signal; and a second combiner configured to combine the second amplified signal and the third amplified signal to generate a second output signal.

30. The apparatus of claim 29:

wherein the first combiner comprises a first coupling capacitor configured to capacitively couple the first amplified signal and the first output signal and a second coupling capacitor configured to capacitively couple the fourth amplified signal and the first output signal;

wherein the second combiner comprises a third coupling capacitor configured to capacitively couple the second amplified signal and the second output signal and a fourth coupling capacitor configured to capacitively couple the third amplified signal and the second output signal;

wherein the voltage produced by the first DC voltage source is approximately equally divided between the first and second amplifying modules;

wherein at least one of the first amplifying module or the second amplifying module comprises an inverter amplifier, wherein the inverter amplifier comprises an electrically isolated transistor, wherein the electrically isolated transistor comprises an electrically isolated PMOS transistor and an electrically isolated NMOS transistor.

* * * * *